US011891697B2

(12) United States Patent
Ohashi et al.

(10) Patent No.: US 11,891,697 B2
(45) Date of Patent: Feb. 6, 2024

(54) SUBSTRATE PROCESSING APPARATUS

(71) Applicant: KOKUSAI ELECTRIC CORPORATION, Tokyo (JP)

(72) Inventors: Naofumi Ohashi, Toyama (JP); Takashi Yahata, Toyama (JP); Yukinori Aburatani, Toyama (JP); Shun Matsui, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 262 days.

(21) Appl. No.: 17/208,306

(22) Filed: Mar. 22, 2021

(65) Prior Publication Data
US 2021/0395887 A1 Dec. 23, 2021

(30) Foreign Application Priority Data

Jun. 17, 2020 (JP) .................................. 2020-104646

(51) Int. Cl.
*C23C 16/458* (2006.01)
*H01L 21/02* (2006.01)
(Continued)

(52) U.S. Cl.
CPC ........ *C23C 16/4584* (2013.01); *C23C 16/345* (2013.01); *C23C 16/401* (2013.01); *H01L 21/022* (2013.01); *H01L 21/0217* (2013.01); *H01L 21/02164* (2013.01); *H01L 21/02271* (2013.01)

(58) Field of Classification Search
CPC ........... H01L 21/6719; H01L 21/02271; H01L 21/67748; C23C 16/4584; C23C 16/54
See application file for complete search history.

(56) References Cited

U.S. PATENT DOCUMENTS

2002/0064450 A1* 5/2002 Coomer ............ H01L 21/68728
414/941
2002/0150456 A1* 10/2002 Kim .................. H01L 21/68707
414/728
(Continued)

FOREIGN PATENT DOCUMENTS

JP 10-125758 A 5/1998
JP 2001-077171 A 3/2001
(Continued)

OTHER PUBLICATIONS

Japanese Office Action dated Aug. 31, 2021 for Japanese Patent Application No. 2020-104646.
(Continued)

*Primary Examiner* — Joseph A Miller, Jr.
(74) *Attorney, Agent, or Firm* — Volpe Koenig

(57) ABSTRACT

There is provided a technique that includes: a process chamber in which a substrate is processed; a gas supplier configured to supply a gas into the process chamber; at least one substrate mounting table disposed in the process chamber and including a substrate mounting surface on which the substrate is mounted; and an arm configured to transfer the substrate to the substrate mounting surface while supporting a lower surface of the substrate, wherein the arm includes a support that includes an inclination and is configured to support the substrate.

13 Claims, 16 Drawing Sheets

(51) Int. Cl.
    *C23C 16/34*          (2006.01)
    *C23C 16/40*          (2006.01)

(56) References Cited

U.S. PATENT DOCUMENTS

| | | | |
|---|---|---|---|
| 2003/0035709 A1* | 2/2003 | Cox | H01L 21/67742 118/719 |
| 2008/0152463 A1* | 6/2008 | Chidambaram | H01L 21/67742 414/217 |
| 2015/0044008 A1 | 2/2015 | Tseng et al. | |
| 2018/0277405 A1 | 9/2018 | Shimamoto et al. | |
| 2019/0393057 A1 | 12/2019 | Shimamoto et al. | |

FOREIGN PATENT DOCUMENTS

| | | |
|---|---|---|
| JP | 2018-160507 A | 10/2018 |
| JP | 2019-033220 A | 2/2019 |
| KR | 10-2019-0037032 A | 4/2019 |
| TW | 666335 B | 7/2019 |

OTHER PUBLICATIONS

Korean Office Action dated Aug. 29, 2022 for Korean Patent Application No. 10-2021-0036685.
Japanese Office Action dated Aug. 25, 2021 for Japanese Patent Application No. 2020-104646.
Taiwan Office Action dated Mar. 30, 2022 for Taiwan Patent Application No. 110107820.

* cited by examiner

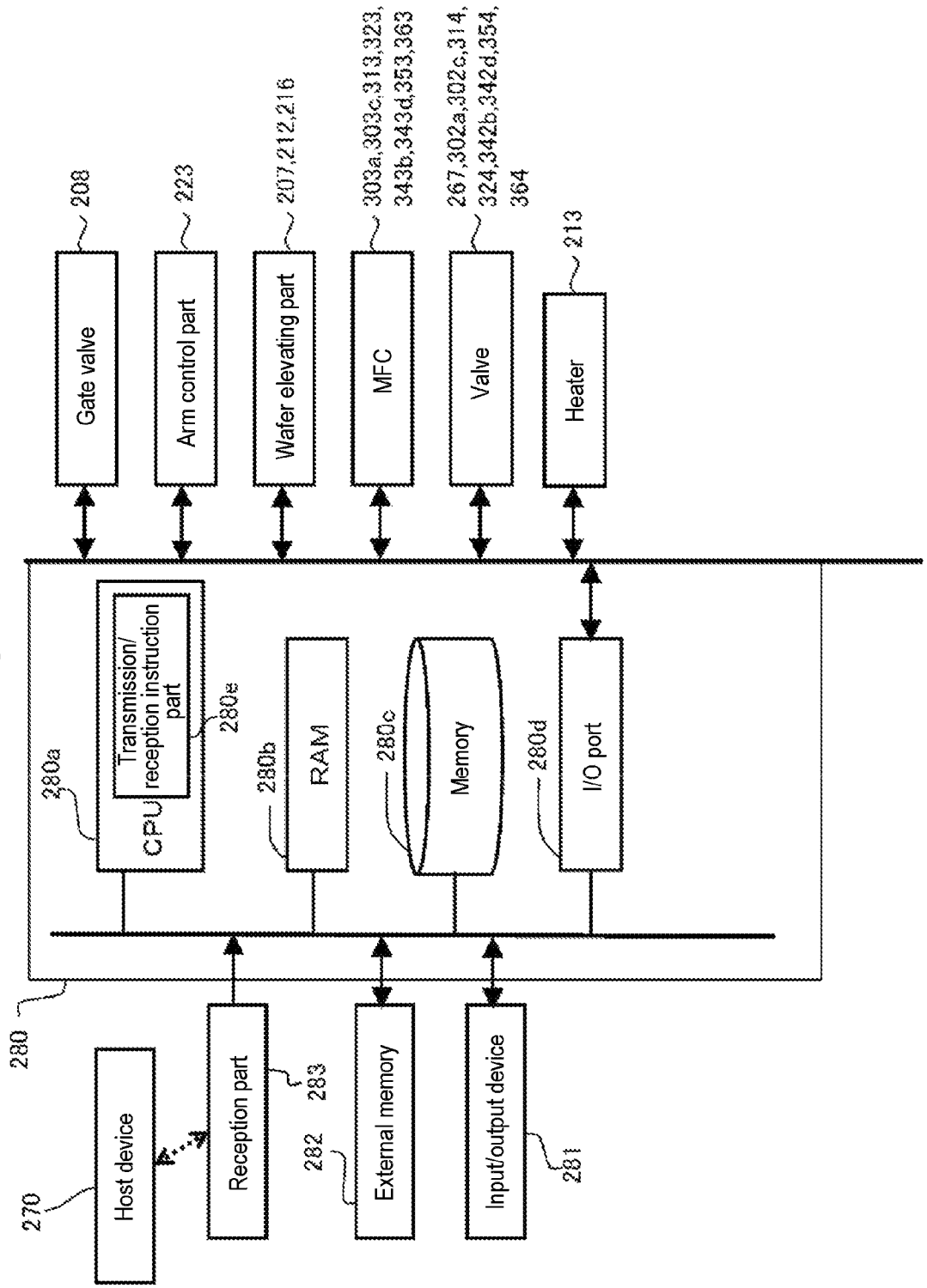

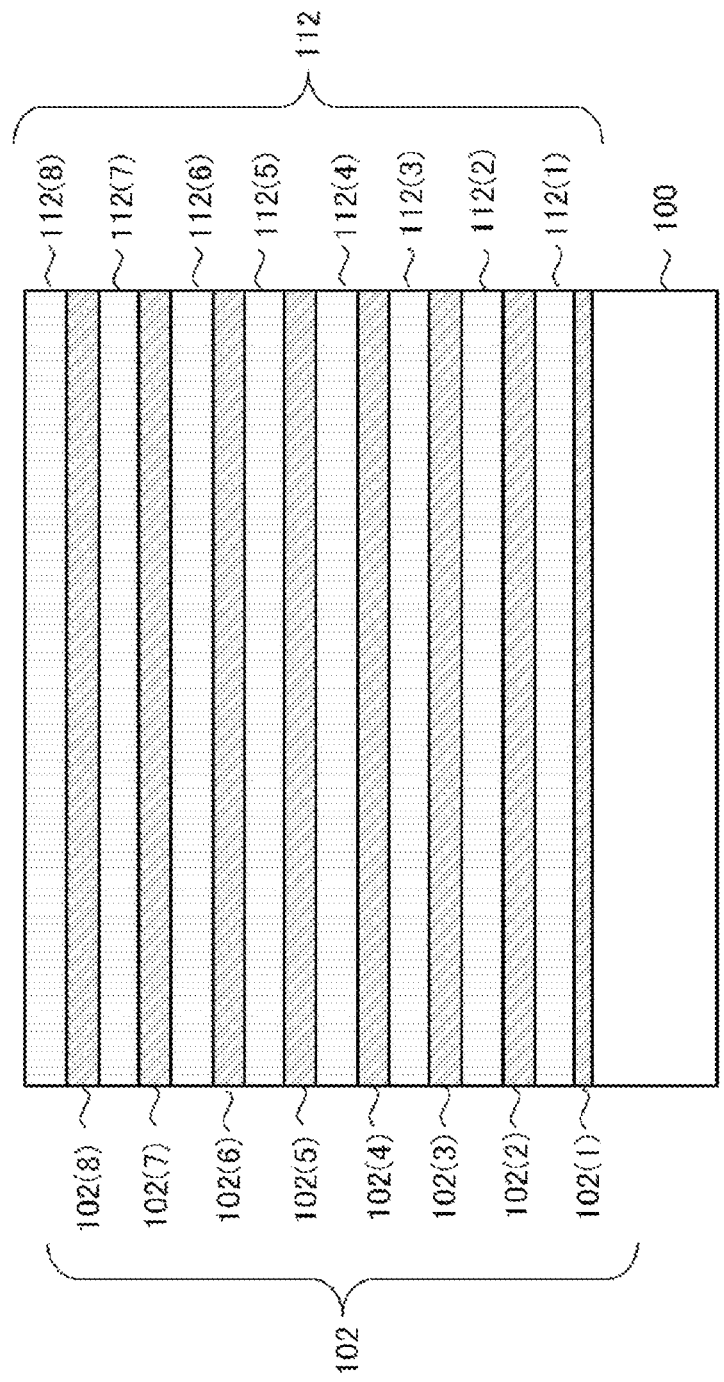

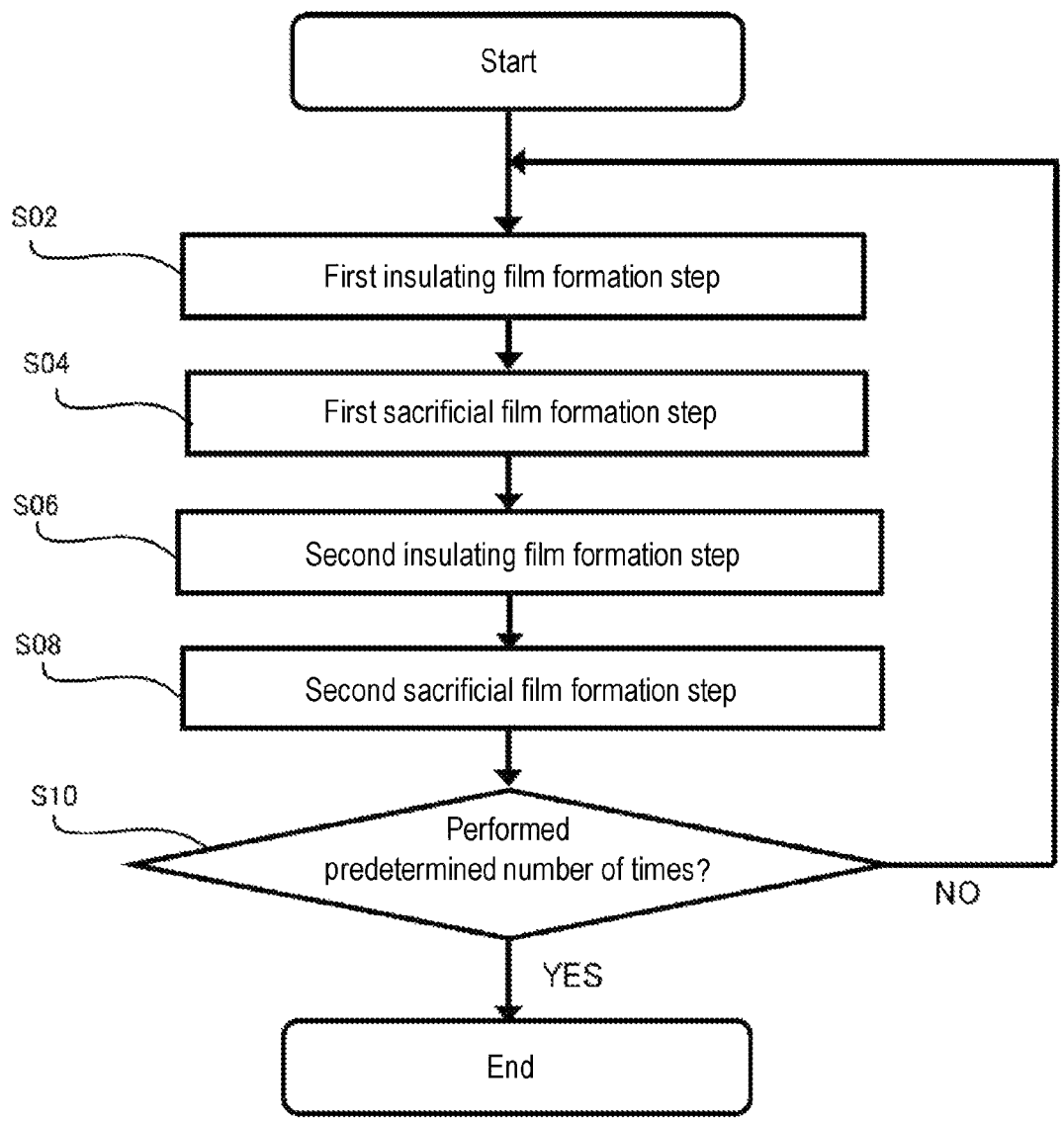

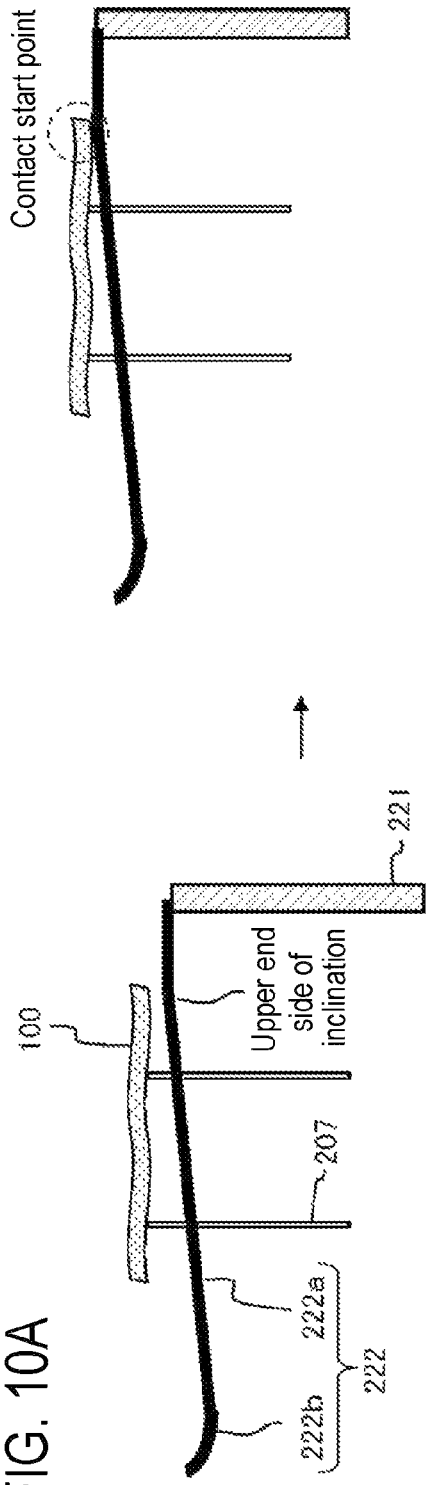
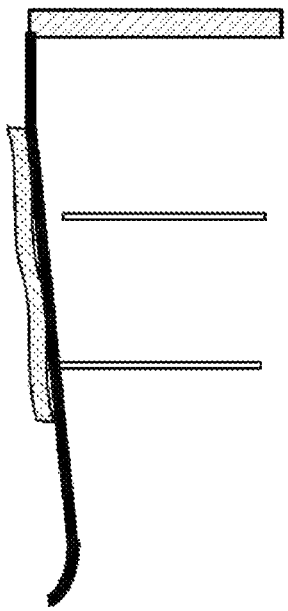

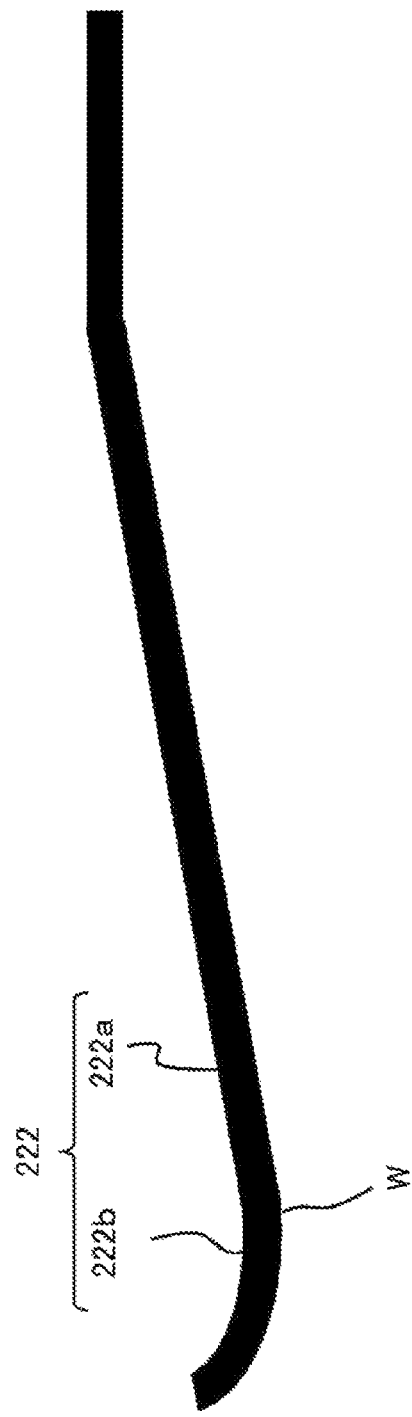

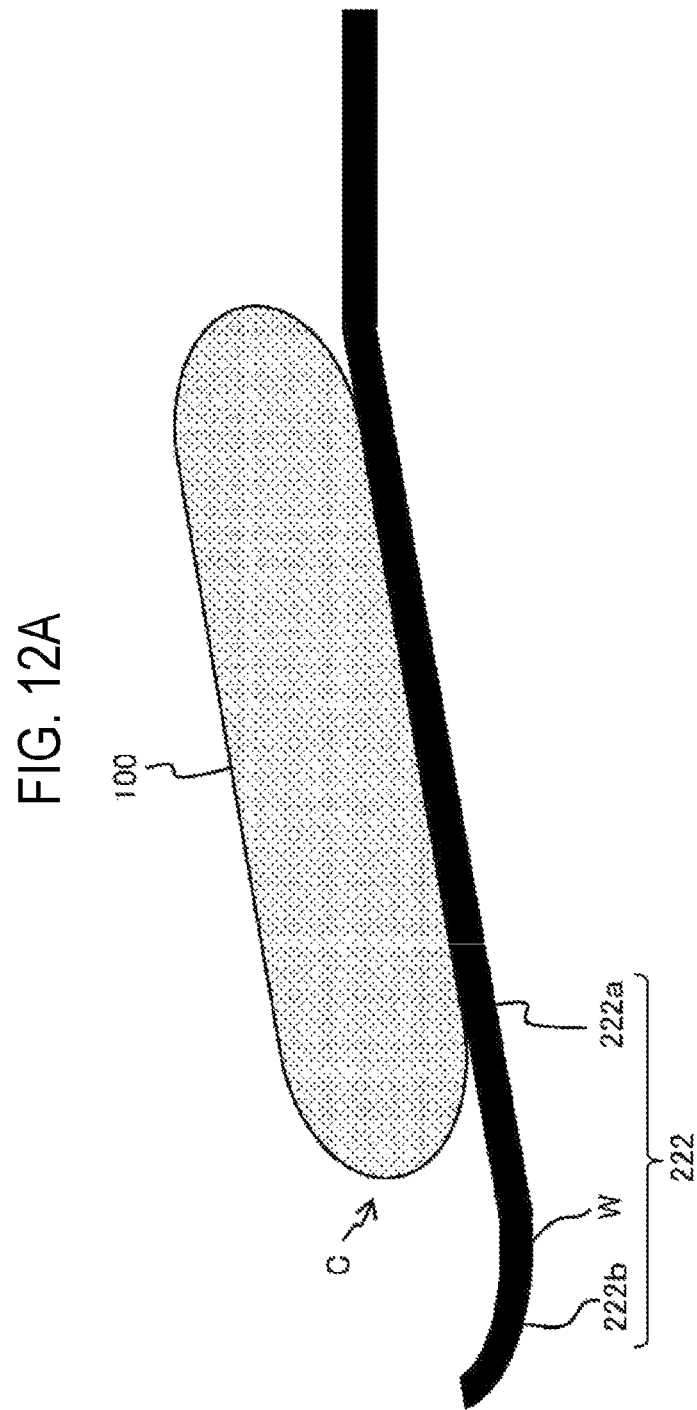

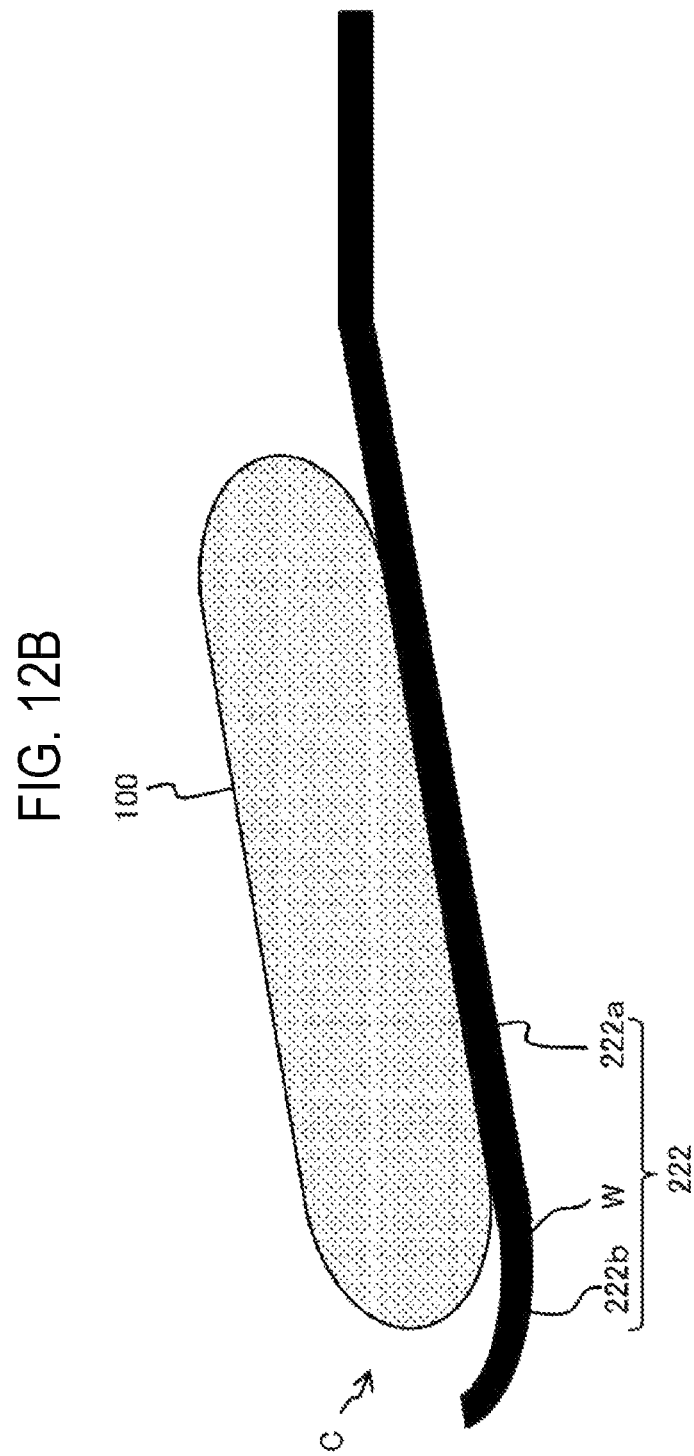

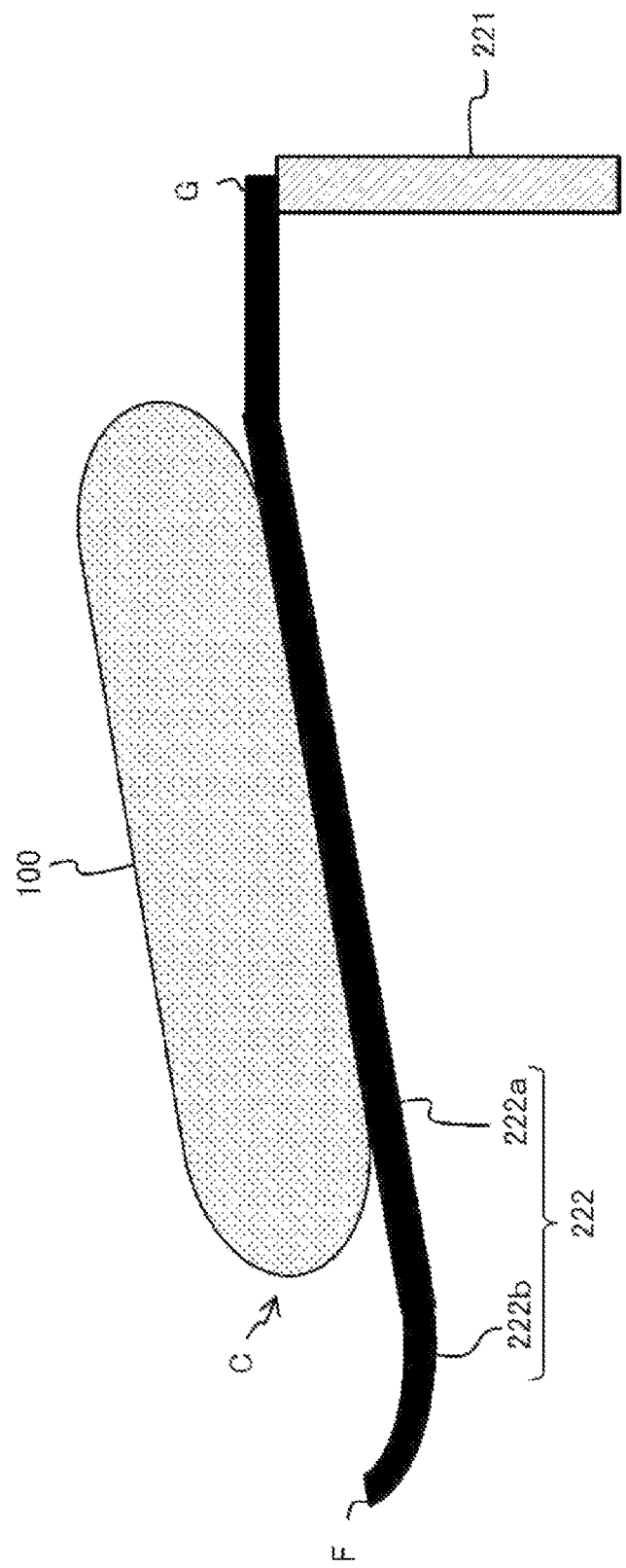

SUBSTRATE PROCESSING APPARATUS

CROSS-REFERENCE TO RELATED APPLICATION

This application is based upon and claims the benefit of priority from Japanese Patent Application No. 2020-104646, filed on Jun. 17, 2020, the entire contents of which are incorporated herein by reference.

TECHNICAL FIELD

The present disclosure relates to a substrate processing apparatus.

BACKGROUND

In the related art, as a process of manufacturing a semiconductor device, a process of forming a film on a substrate is often carried out.

In the process of forming the film, the substrate may be deformed. Since the deformed substrate is unstable, the substrate may be dropped when being transferred.

SUMMARY

Some embodiments of the present disclosure provide a technique that stably transfers a deformed substrate without dropping the substrate.

According to some embodiments of the present disclosure, there is provided a technique that includes: a process chamber in which a substrate is processed; a gas supplier configured to supply a gas into the process chamber; at least one base disposed in the process chamber and including a substrate mounting surface on which the substrate is mounted; and an arm configured to transfer the substrate to the substrate mounting surface while supporting a lower surface of the substrate, wherein the arm includes a support that includes an inclination and is configured to support the substrate.

BRIEF DESCRIPTION OF DRAWINGS

The accompanying drawings, which are incorporated in and constitute a part of the specification, illustrate embodiments of the present disclosure.

FIG. 7 is a schematic configuration diagram of a controller of a substrate processing apparatus according to some embodiments of the present disclosure, in which a control system of the controller is shown in a block diagram.

FIG. 8 is an explanatory view illustrating a processing state of a wafer according to some embodiments of the present disclosure.

FIG. 9 is a flowchart of an outline of substrate processing according to some embodiments of the present disclosure.

FIGS. 10A to 10C are views illustrating an operation of a rotation arm in a substrate processing apparatus according to some embodiments of the present disclosure. FIG. 10A is a view illustrating a state before a rotation arm mounts a wafer. FIG. 10B is a view illustrating a state in which a rotation arm starts mounting the wafer. FIG. 10C is a view illustrating a state after a rotation arm mounts the wafer.

FIG. 11 is a side view of a rotation arm in a substrate processing apparatus according to some embodiments of the present disclosure.

FIGS. 12A and 12B are views illustrating a relationship between a rotation arm and a wafer in a substrate processing apparatus according to some embodiments of the present disclosure. FIG. 12A is a view illustrating a state in which a rotation arm mounts a wafer. FIG. 12B is a view illustrating a state in which a rotation arm rotates to transfer a wafer.

FIG. 13A is a view illustrating a state in which a rotation arm mounts a wafer. FIG. 13B is a view illustrating a state in which a rotation arm rotates to transfer the wafer.

FIG. 14 is a view illustrating a state in which a rotation arm of a substrate processing apparatus according to some embodiments of the present disclosure mounts the wafer.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Some embodiments of the present disclosure will now be described.

(1) Configuration of Substrate Processing Apparatus

First, a configuration of a substrate processing apparatus according to some embodiments of the present disclosure will be described with reference to FIGS. 1 to 7. The substrate processing apparatus according to the embodiments is used in a process of manufacturing a semiconductor device, and is configured as an apparatus which processes a plurality of substrates to be processed together. The substrates to be processed may include, for example, semiconductor wafer substrates (hereinafter, simply referred to as "wafers") in which semiconductor devices (semiconductor devices) are built.

(Process Container)

Figure 1:
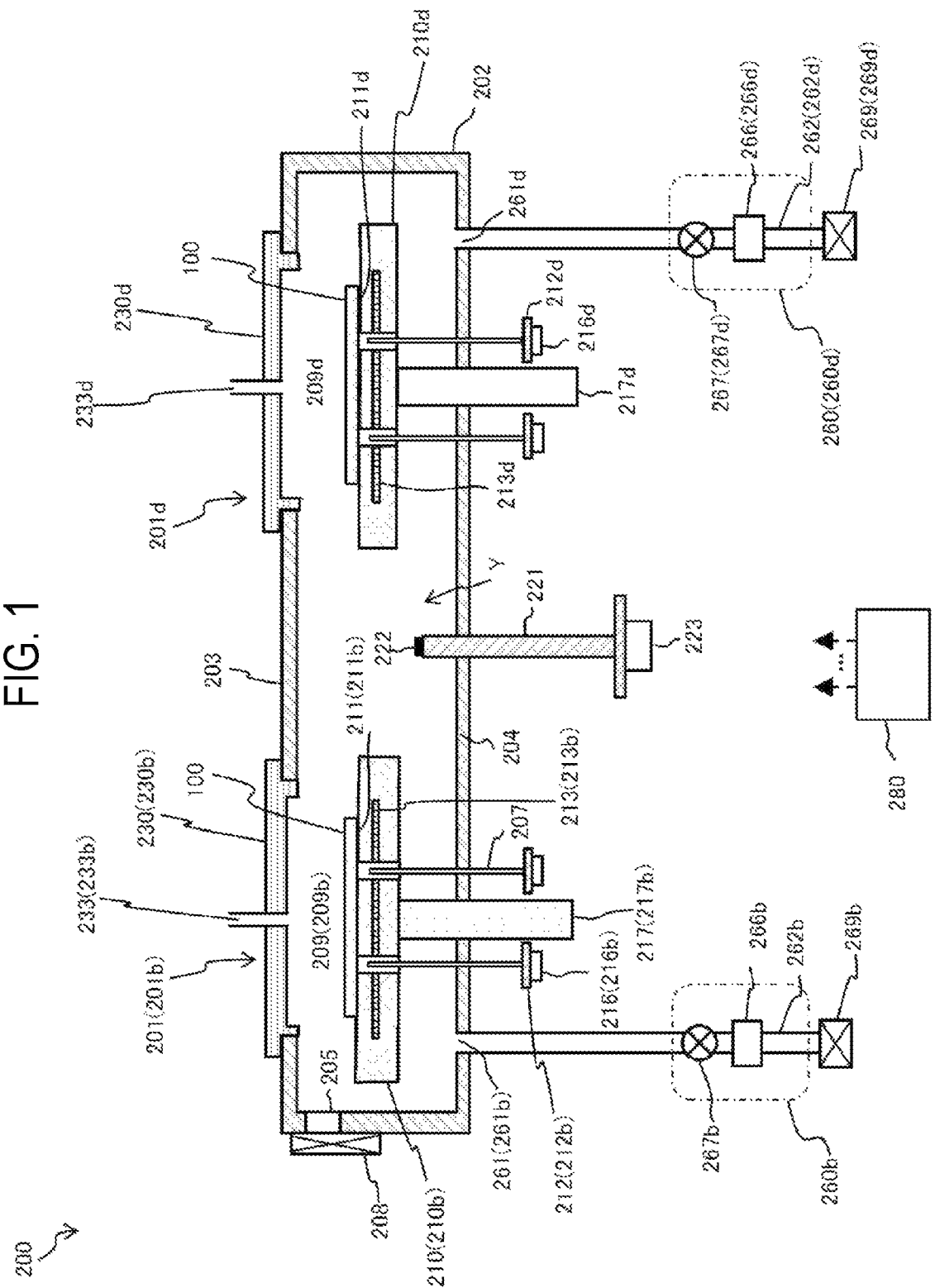
FIG. 1 is a schematic cross-sectional view of a main part of a multiple single-wafer-type substrate processing apparatus according to some embodiments of the present disclosure.

As illustrated in FIG. 1, a substrate processing apparatus 200 includes a process container 202. The process container 202 has, for example, a square cross section, and is configured as a flat sealed container. The process container 202 is made of a metal material such as aluminum (Al) and stainless steel (SUS). A process chamber 201 in which wafers 100 such as silicon wafers are processed is formed in the process container 202. The process chamber 201 includes a gas distribution structure 230, a base 210 as a substrate mounting table, and the like, which are described below.

A substrate loading/unloading port 205 adjacent to a gate valve 208 is installed at a side surface of the process container 202, in which the wafers 100 are moved to and from a transfer chamber (not shown) via the substrate loading/unloading port 205.

Figure 2:
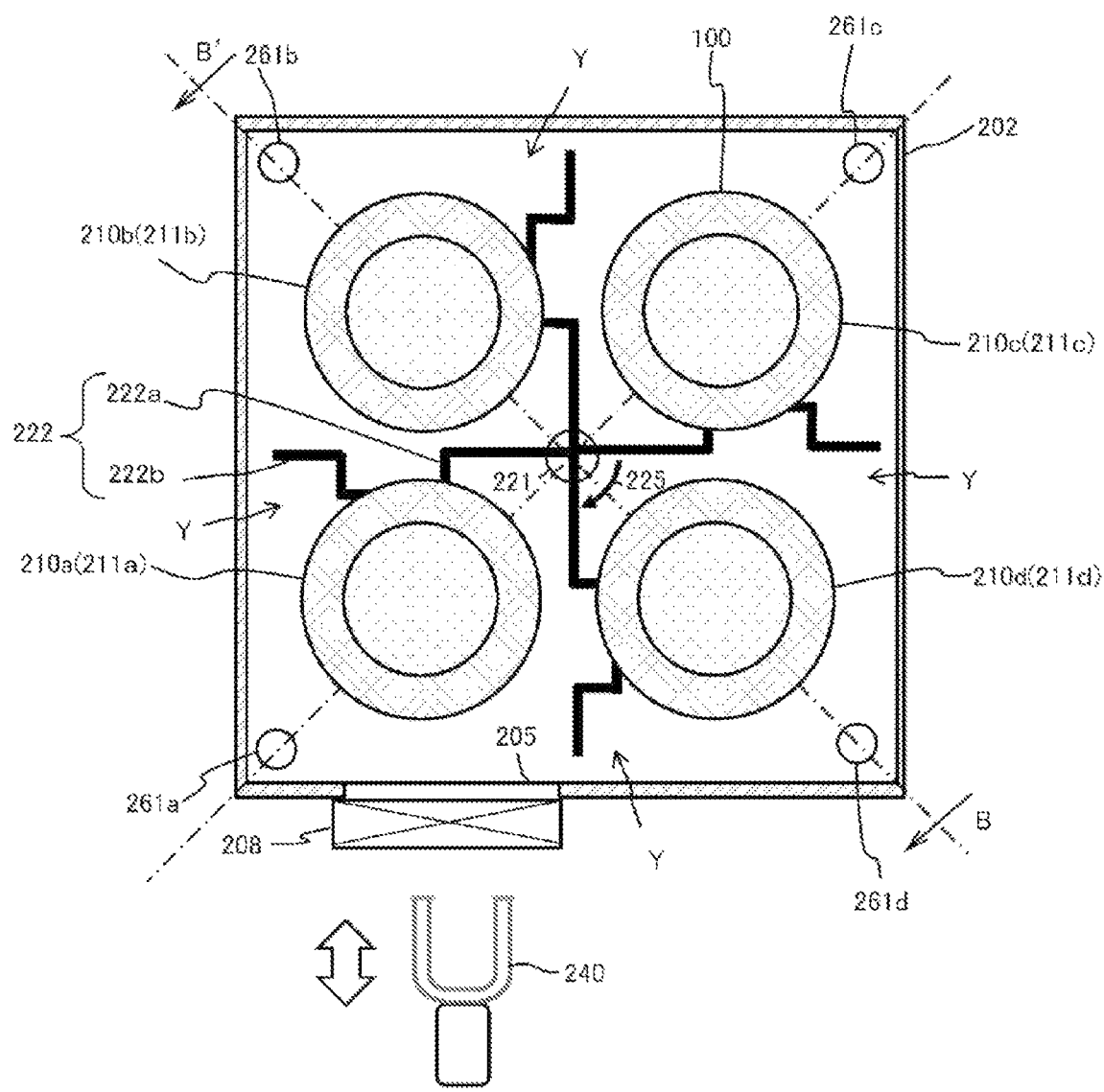
FIG. 2 is a schematic plane view of a main part of a substrate processing apparatus according to some embodiments of the present disclosure.

The base 210 configured to heat the wafers 100 is disposed in the process chamber 201. A plurality of bases 210 may be arranged in a circumferential manner around a rotary shaft 221 to be described below. The arrangement of the bases 210 will be described with reference to FIG. 2. FIG. 2 is a view of a periphery of a rotation arm 222 as an arm to be described below, as viewed from above. A robot arm 240 is disposed outside the process container 202, and has a function of transferring the wafers 100 into and out of the process container 202. A vertical cross-sectional view in B-B' corresponds to FIG. 1.

For example, four bases 210 may be arranged. Specifically, bases 210a, 210b, 210c and 210d are arranged clockwise from a position opposite to the substrate loading/unloading port 205. The wafers 100 loaded into the process container 202 are moved in the order of the bases 210a to 210d.

The bases 210a to 210d respectively include substrate mounting surfaces 211 (211a, 211b, 211c and 211d) on which the wafers 100 are mounted, shafts 217 (217a, 217b, 217c and 217d) configured to support the bases 210, and heaters 213 (213a, 213b, 213c and 213d) as heating sources. At the bases 210, through-holes which lift pins 207 penetrate are respectively formed at positions corresponding to the lift pins 207. The shafts 217 penetrate a bottom 204 of the process container 202. The shafts 217 are insulated from the process container 202.

The lift pins 207 are installed to penetrate the bottom 204. The lift pins 207 are disposed at positions at which they may penetrate the through-holes installed at the bases 210. Front ends of the lift pins 207 support the wafers 100 during substrate loading/unloading or the like.

Lift pin supports 212 (212a, 212b, 212c and 212d) are installed at lower ends of the lift pins 207. Lift pin elevating parts 216 (216a, 216b, 216c and 216d) are installed at the lift pin supports 212a to 212d respectively. The lift pin elevating parts 216 raise or lower the lift pins 207. The lift pin supports 212a to 212d and the lift pin elevating parts 216a to 216d are installed to correspond to the bases 210a to 210d, respectively. The lift pins 207, the lift pin supports 212, and the lift pin elevating parts 216 will be generally referred to a wafer elevating part.

Figure 3:
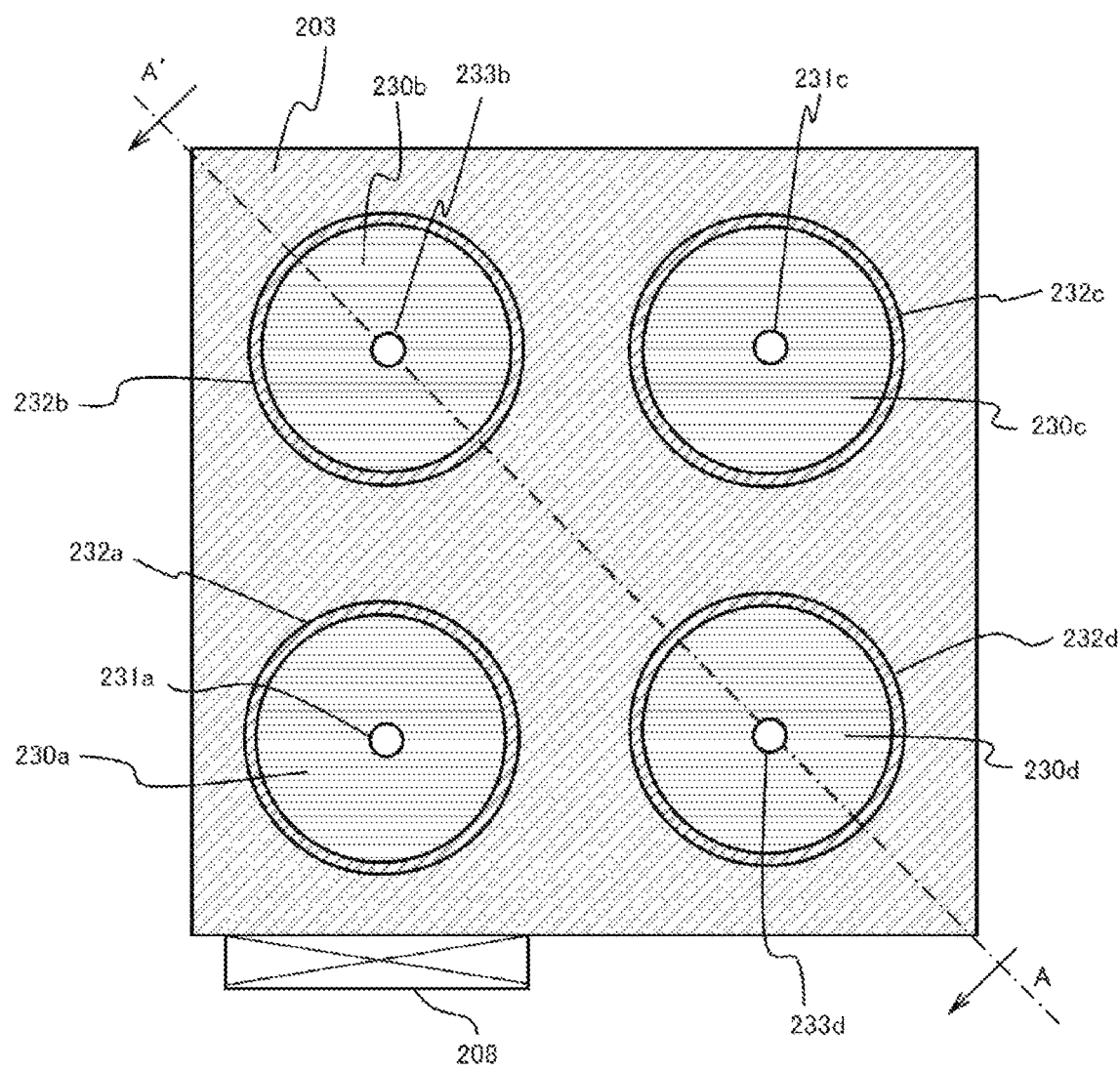
FIG. 3 is a schematic plane view of a main part of a substrate processing apparatus according to some embodiments of the present disclosure.

Gas distribution structures 230 (230a, 230b, 230c and 230d) as gas distribution mechanisms, which serve as a lid 203 of the process container 202, are installed at positions opposite to the substrate mounting surfaces 211a to 211d respectively. As illustrated in FIG. 3, four gas distribution structures 230 are arranged, as viewed from above. The gas distribution structures 230 are supported by the lid 203.

As illustrated in FIG. 3, a gas introduction hole is installed at each of the gas distribution structures 230. Specifically, a gas introduction hole 231a is installed at the gas distribution structure 230a, a gas introduction hole 233b is installed at the gas distribution structure 230b, a gas introduction hole 231c is installed at the gas distribution structure 230c, and a gas introduction hole 233d is installed at the gas distribution structure 230d. The gas introduction holes 231a and 231c are in fluid communication with a first gas supply pipe 311 to be described below. The gas introduction holes 233b and 233d are in fluid communication with a common gas supply pipe 341 to be described below. A vertical cross-sectional view in a line A-A' corresponds to FIG. 1.

Spaces between the gas distribution structures 230a to 230d and the substrate mounting surfaces 211a to 211d will be referred to as process spaces 209 (209a, 209b, 209c and 209d). In the embodiments, the space between the gas distribution structure 230a and the substrate mounting surface 211a will be referred to as the process space 209a. The space between the gas distribution structure 230b and the substrate mounting surface 211b will be referred to as the process space 209b. The space between the gas distribution structure 230c and the substrate mounting surface 211c will be referred to as the process space 209c. The space between the gas distribution structure 230d and the substrate mounting surface 211d will be referred to as the process space 209d.

Further, the structure constituting the process spaces 209 will be referred to as the process chamber 201. In the embodiments, the structure constituting the process space 209a and including at least the gas distribution structure 230a and the base 210a will be referred to as a process chamber 201a. The structure constituting the process space 209b and including at least the gas distribution structure 230b and the base 210b will be referred to as a process chamber 201b. The structure constituting the process space 209c and including at least the gas distribution structure 230c and the base 210c will be referred to as a process chamber 201c. The structure constituting the process space 209d and including at least the gas distribution structure 230d and the base 210d will be referred to as a process chamber 201d.

It has been described herein that the process chamber 201a includes at least the gas distribution structure 230a and the base 210a, but the process chamber 201a may have any structure as long as it constitutes the process space 209 in which the wafers 100 are processed and is not limited to the structure including the gas distribution structure 230 and the like. The same applies to the other process chambers 201b to 201d.

As illustrated in FIG. 2, the bases 210a to 210d are arranged in a circumferential manner around the rotary shaft 221. The rotation arm 222 supporting the lower surface of the wafer 100 mounted on the substrate mounting surface (for example, the substrate mounting surface 211a) and transferring the wafer 100 to its adjacent substrate mounting surface (for example, the substrate mounting surface 211b) is installed at the rotary shaft 221. In the embodiments, four rotation arms 222 are installed at the rotary shaft 221.

The rotary shaft 221 is configured to penetrate the bottom 204 of the process container 202. A rotation arm elevating rotation part (hereinafter, sometimes referred to as an "arm elevation part") 223 is installed outside the process container 202 and on the other side from the rotation arms 222. The arm elevating rotation part 223 elevates and rotates the rotation arms 222 by elevating and rotating the rotary shaft 221. The rotation direction is, for example, a direction of an arrow 225 (a clockwise direction) in FIG. 2.

Further, in the embodiments, a component with a function of elevating the rotation arms 222 and a function of rotating the rotation arms 222 is referred to as the arm elevating rotation part, but the component may be configured such that it has one of the functions independently. In such a case, the component will be referred to as an arm rotation part or an arm elevation part. Further, in the case of a configuration where the component has both or either of the functions, the component will be referred to as an arm control part.

A specific configuration and a specific operation of the rotation arms 222 will be described below.

(Exhaust System)

Exhaust systems 260 configured to exhaust an atmosphere of the process container 202 will be described. The exhaust systems 260 are installed to correspond to the respective process spaces 209 (209a to 209d) (see FIG. 1). For example, the process space 209a corresponds to an exhaust system 260a, the process space 209b corresponds to an exhaust system 260b, the process space 209c corresponds to an exhaust system 260c, and the process space 209d corresponds to an exhaust system 260d.

The exhaust systems 260 includes exhaust pipes 262 (262a, 262b, 262c and 262d) in fluid communication with exhaust holes 261 (261a, 261b, 261c and 261d) installed at the process container 202 and further includes auto pressure controllers (APCs) 266 (266a, 266b, 266c and 266d) installed at the exhaust pipes 262. The APCs 266 each include a valve body (not shown) whose opening degree may be adjusted, and regulate conductance of the exhaust pipes 262 according to an instruction from a controller 280. In addition, valves 267 (267a, 267b, 267c and 267d) are installed at the exhaust pipes 262 on the upstream side of the APCs 266. The exhaust pipes 262, the valves 267 and the APCs 266 will be generally referred to as the exhaust systems 260.

Dry pumps (DPs) 269 (269a, 269b, 269c and 269d) are installed at the downstream of the exhaust pipes 262. The DPs 269 exhaust the atmosphere of the process chamber 201 via the exhaust pipes 262. In the embodiments, the DP 269 is installed for each of the exhaust systems 260, but the present disclosure is not limited thereto but the DP 269 may be used in common for the exhaust systems.

(First Gas Supplier)

Figure 5:
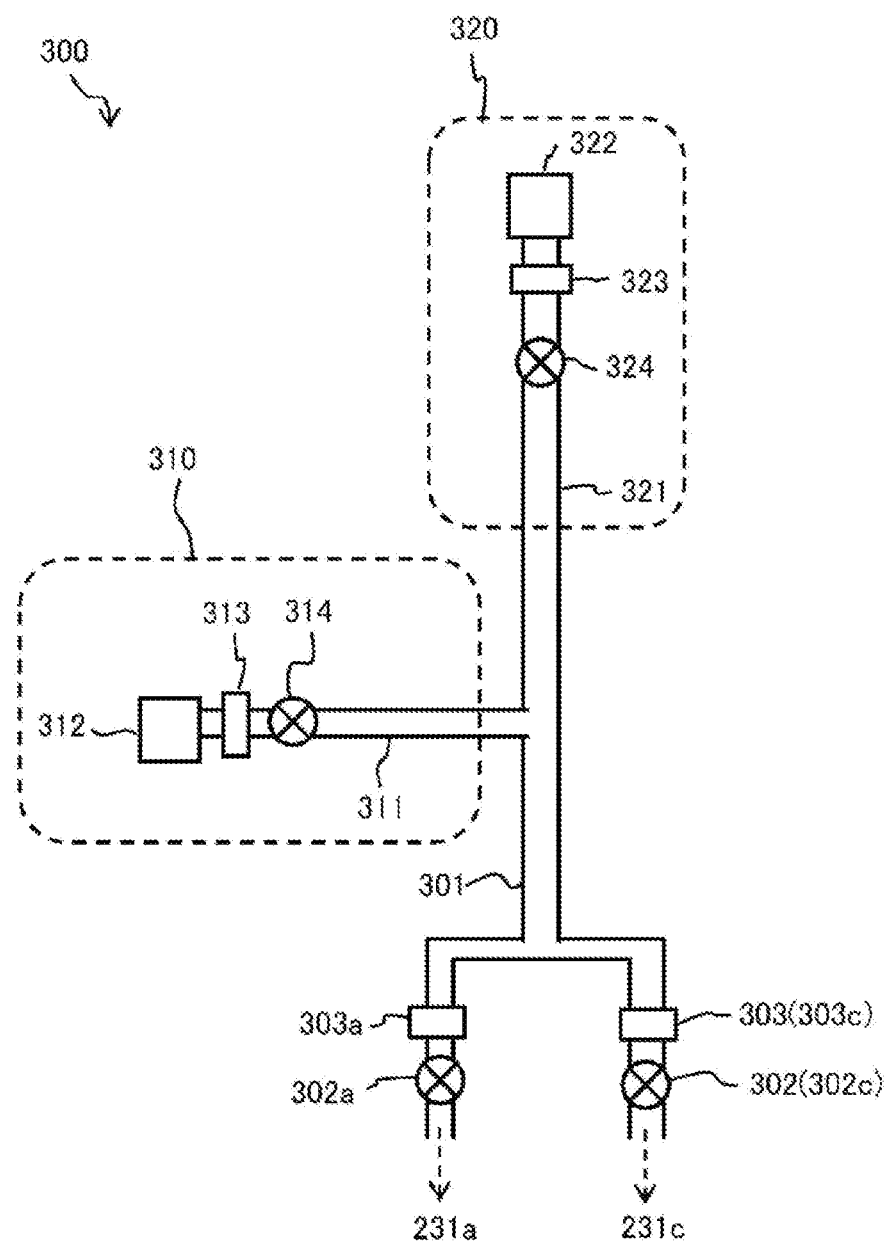
FIG. 5 is a diagram illustrating a gas supplier of a substrate processing apparatus according to some embodiments of the present disclosure.

A first gas supplier 300 in fluid communication with the gas introduction holes 231a and 231c will be described with reference to FIG. 5.

The gas distribution structures 230a and 230c are connected to a common gas supply pipe 301 via the valves 302a and 302c and the mass flow controllers (MFCs) 303a and 303c, which are flow rate controllers (flow rate control parts) such that the gas introduction holes 231a and 231c is in fluid communication with the common gas supply pipe 301. A supply amount of a gas to each of the process chambers 201a and 201c is regulated by using the valves 302a and 302c and the MFCs 303a and 303c. A first gas supply pipe 311 and a second gas supply pipe 321 are connected to the common gas supply pipe 301.

A first gas source 312, an MFC 313, and a valve 314, which is an opening/closing valve, are installed at the first gas supply pipe 311 sequentially from the corresponding upstream side.

The first gas source 312 is a source of a first gas containing a first element (referred to as a "first element-containing gas"). The first element-containing gas is a precursor gas, that is, a processing gas. In the embodiments, the first element is silicon (Si). That is, the first element-containing gas is a Si-containing gas. Specifically, a dichlorosilane (referred to as $SiH_2Cl_2$, abbreviation: DCS) or a hexachlorodisilane (referred to as $Si_2Cl_6$, abbreviation: HCDS) gas is used as the Si-containing gas.

A first gas supply system 310 (referred to as a Si-containing gas supply system) mainly includes the first gas supply pipe 311, the MFC 313, and the valve 314.

A second gas source 322, an MFC 323, and a valve 324 are installed at the second gas supply pipe 321 sequentially from the corresponding upstream side.

The second gas source 322 is a source of a second gas containing a second element (hereinafter, referred to as a "second element-containing gas"). The second element-containing gas is a processing gas. Further, the second element-containing gas may be considered as a reaction gas.

In the embodiments, the second element-containing gas contains the second element different from the first element. The second element-containing gas is, for example, oxygen (O). In the embodiments, the second element-containing gas is, for example, an O-containing gas. Specifically, an ozone ($O_3$) gas is used as the O-containing gas.

A second gas supply system 320 (referred to as a reaction gas supply system) mainly includes the second gas supply pipe 321, the MFC 323, and the valve 324.

One or a combination of the first gas supply system and the second gas supply system will be referred to as the first gas supplier 300.

(Second Gas Supplier)

Figure 6:
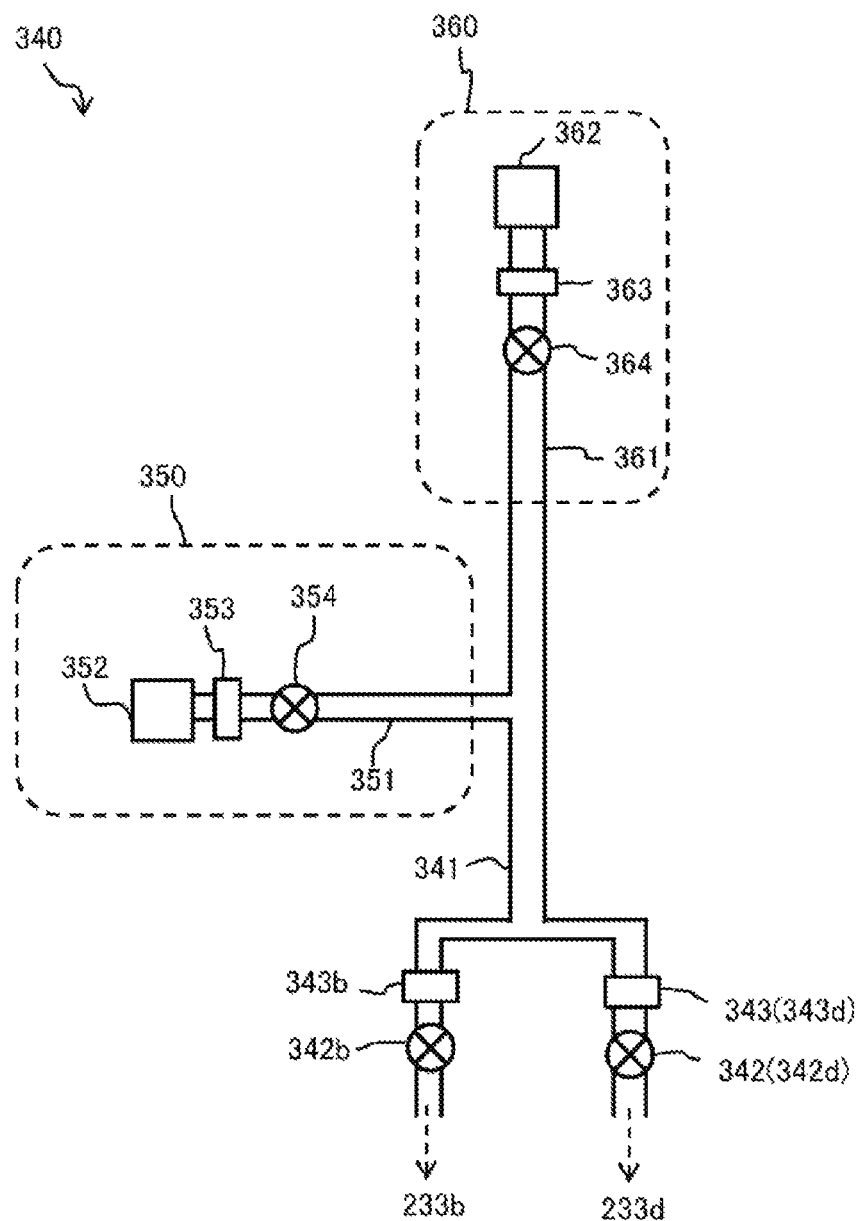
FIG. 6 is a diagram illustrating a gas supplier of a substrate processing apparatus according to some embodiments of the present disclosure.

A second gas supplier 340 in fluid communication with the gas introduction holes 233b and 233d will be described with reference to FIG. 6.

The gas distribution structures 230b and 230d are connected to the common gas supply pipe 341 via the valves 342b and 342d and the MFCs 343b and 343d such that the gas introduction holes 233b and 233d are in fluid communication with the common gas supply pipe 341. The supply amount of a gas to each of the process chambers 201b and 201d is regulated by using the valves 342b and 342d and the MFCs 343b and 343d. A third gas supply pipe 351 and a fourth gas supply pipe 361 are connected to the common gas supply pipe 341.

A third gas source 352, an MFC 353, and a valve 354 are installed at the third gas supply pipe 351 sequentially from the corresponding upstream side.

The third gas source 352 is a first element-containing gas source. Similar to the first gas source 312, a Si-based gas may be used. The third gas source 352 may be shared with the first gas source 312.

A third gas supply system 350 (referred to as a Si-containing gas supply system) mainly includes the third gas supply pipe 351, the MFC 353, and the valve 354.

A fourth gas source 362, an MFC 363, and a valve 364 are installed at the fourth gas supply pipe 361 sequentially from the corresponding upstream side.

The fourth gas source 362 is a source of a third gas containing a third element (hereinafter, referred to as a "third element-containing gas"). The third element-containing gas is a processing gas. The third element-containing gas may be considered as a reaction gas.

In the embodiments, the third element-containing gas contains the third element different from the second element. The third element is, for example, nitrogen (N). In the embodiments, the second element-containing gas is, for example, a N-containing gas. Specifically, an ammonia ($NH_3$) gas is used as the N-containing gas.

A fourth gas supply system 360 (referred to as a reaction gas supply system) mainly includes the fourth gas supply pipe 361, the MFC 363, and the valve 364.

Further, one or a combination of the third gas supply system and the fourth gas supply system will be referred to as the second gas supplier 340.

Further, the first gas supplier 300 and the second gas supplier 340 may be generally and simply referred to as the gas supplier.

(Controller)

The substrate processing apparatus 200 includes the controller 280 configured to control operations of the respective parts of the substrate processing apparatus 200. As illustrated in FIG. 7, the controller 280 includes at least a calculation part (CPU) 280a, a temporary memory (RAM) 280b, a memory 280c, and an I/O port 280d. The controller 280 is connected to each of the components of the substrate processing apparatus 200 via the I/O port 280d, and calls a program or recipe from the memory 280c according to an instruction of a host device 270 or a user and controls the operations of the respective components according to contents of the program or recipe.

Transmission/reception control is performed by, for example, a transmission/reception instruction part 280e in the CPU 280a. The controller 280 may be configured as a dedicated computer or a general-purpose computer. For example, the controller 280 according to the embodiments may be configured by installing, on the general-purpose computer, the aforementioned program stored in an external memory 282 (for example, a magnetic disc such as a magnetic tape, a flexible disc, or a hard disk, an optical disc such as a CD or DVD, a magneto-optical disc such as a MO, or a semiconductor memory such as a USB memory or a memory card).

Further, components configured to supply the program to the computer is not limited to those configured to supply the program via the external memory 282. For example, the program may be supplied to the computer by using a communication means such as the Internet or a dedicated line, or the program may be supplied by receiving information from the host device 270 via a reception part 283, instead of via the external memory 282. In addition, the controller 280 may be instructed by using an input/output device 281 such as a keyboard or a touch panel.

Further, the memory 280c or the external memory 282 is configured as a computer-readable recording medium. Hereinafter, the memory 280c and the external memory 282 will be generally and simply referred to as a "recording medium." When the term "recording medium" is used herein, it may indicate a case of including only the memory 280c, a case of including only the external memory 282, or a case of including both the memory 280c and the external memory 282.

(2) Substrate Processing

Next, substrate processing of processing a wafer 100 by using the substrate processing apparatus 200 of the aforementioned configuration, which is a process of manufacturing a semiconductor device, will be described. In the present disclosure, as illustrated in FIG. 8, a case in which an insulating film 102 and a sacrificial film 112 are alternately laminated on the wafer 100 will be described as an example of the substrate processing. FIG. 9 is a flow by which the insulating film 102 and the sacrificial film 112 are laminated on the wafer 100. In the following descriptions, the operations of the respective parts are controlled by the controller 280.

(First Insulating Film Formation Step: S02)

The wafer 100 is maintained at a predetermined temperature in a predetermined process space 209, and a Si-containing gas and an O-containing gas are supplied to the wafer 100. In this manner, a SiO film as an insulating film 102(1) is formed on the wafer 100.

(First Sacrificial Film Formation Step: S04)

The wafer 100 is maintained at a predetermined temperature in a predetermined process space 209, and a Si-containing gas and a N-containing gas are supplied to the wafer 100. In this manner, a SiN film as a sacrificial film 112(1) is formed on the wafer 100.

(Second Insulating Film Formation Step: S06)

The wafer 100 is maintained at a predetermined temperature in a predetermined process space 209, and a Si-containing gas and an O-containing gas are supplied to the wafer 100. In this manner, a SiO film as an insulating film 102(2) is formed on the wafer 100.

(Second Sacrificial Film Formation Step: S08)

The wafer 100 is maintained at a predetermined temperature in a predetermined process space 209, and a Si-containing gas and a N-containing gas are supplied to the wafer 100. In this manner, a SiN film as a sacrificial film 112(2) is formed on the wafer 100.

(Determination Step: S10)

It is determined whether a combination from the first insulating film formation step S02 to the second sacrificial film formation step S08 has been performed a predetermined number of times. That is, it is determined whether the insulating film 102 and the sacrificial film 112 are formed in a predetermined layer. For example, when a desired total number of insulating films 102 and sacrificial films 112 is 16, it is determined whether the aforementioned combination is repeated four times.

If it is determined that the combination has been performed the predetermined number of times, the processing in the substrate processing apparatus 200 is completed, and if it is determined that the combination has not been performed the predetermined number of times, the process proceeds to the first insulating film formation step (S02).

(3) Regarding Rotation Arm

As described above, the rotation arms 222 supports the wafers 100 mounted on the substrate mounting surface (for example, the substrate mounting surface 211a) and transfers the wafer to an adjacent substrate mounting surface (for example, the substrate mounting surface 211b).

In the embodiments, a SiO film and a SiN film are laminated on the wafers 100 transferred by the rotation arms 222. In general, it is known that the SiO film has high compressive stress and the SiN film has high tensile stress. That is, the SiO film and the SiN film have inverse properties in terms of film stress. Such properties of the stresses become remarkable when the films are heated.

In the substrate processing described above, the formation of the insulating film 102 constituted by the SiO film and the formation of the sacrificial film 112 constituted by the SiN film are repeated, but in some films, the wafer 100 is heated with the insulating film 102 and the sacrificial film 112 existing at the same time. For example, when forming a sacrificial film 112(8) (see FIG. 9), the wafer 100 is heated to a temperature at which the SiN film is formed. At that time, the insulating films 102(1) to 102(8) formed below the sacrificial film 112(8) have high compressive stress, and the sacrificial films 112(1) to 112(7) have high tensile stress. Thus, a stress difference occurs between the insulating film 102 and the sacrificial film 112. As a result, the wafer 100 may be deformed.

For example, when the deformed wafer 100 is transferred, a rotation arm including a related-art rod member in a horizontal posture may drop the wafer 100.

The present discloser learned that a direction of contact between the support and the wafer 100 cannot be regulated by the related-art rotation arm because the deformation of the wafer 100 may randomly occur in response to various conditions in the substrate processing.

Based on such learning, the present discloser was inspired to prevent the wafer 100 from being dropped by regulating the direction of contact between the support and the wafer 100, and completed the rotation arm 222 configured to stably transfer the wafer 100 regardless of presence or absence of deformation. A specific configuration and a specific operation of the rotation arms 222 will be described below.

As illustrated in FIG. 2, the rotation arm 222 is formed such that a straight rod member is continuous with multiple corners in a plane view. The wafer 100 may be supported by the vicinity of the multiple corners.

Figure 4:
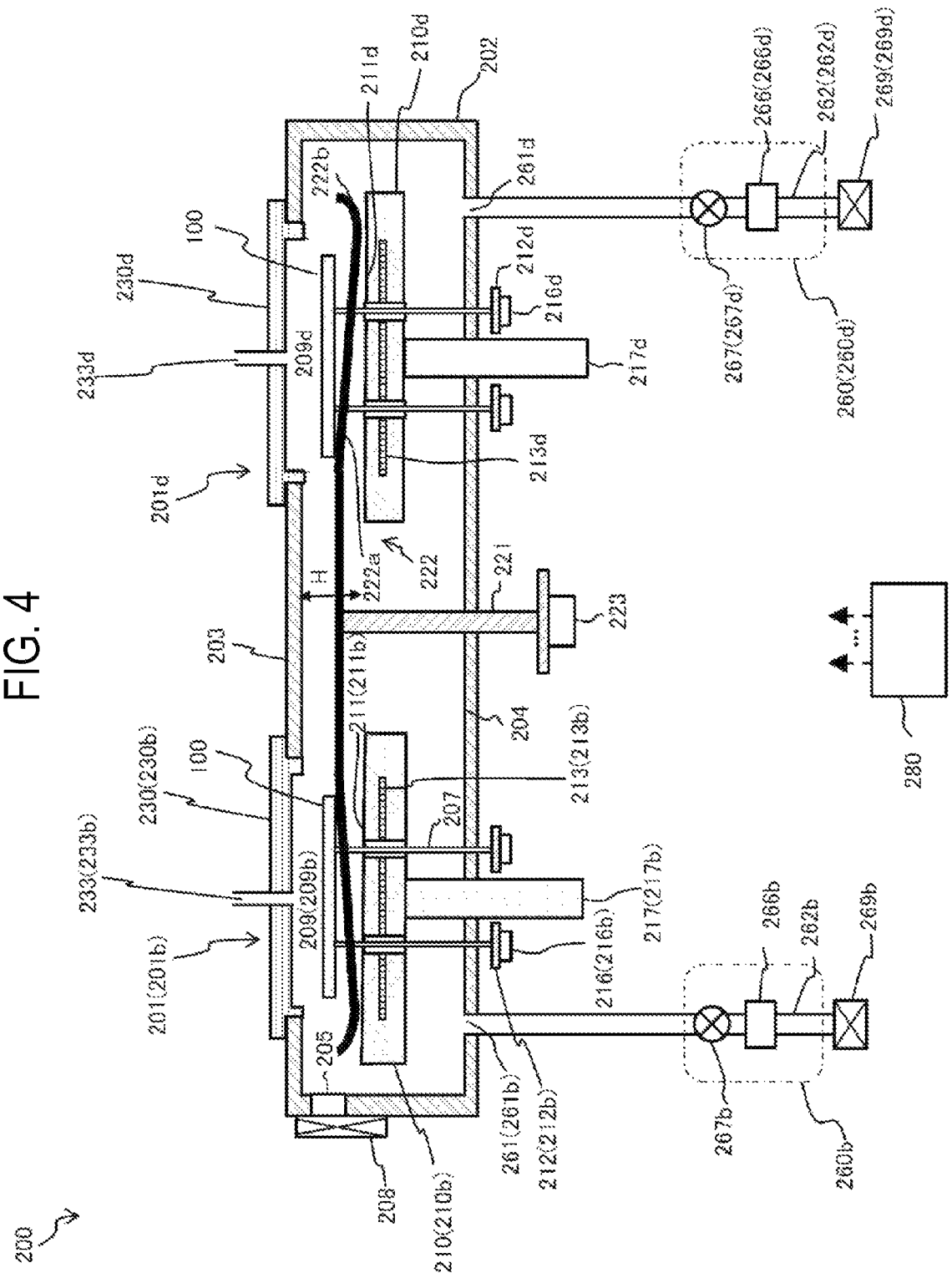
FIG. 4 is a schematic cross-sectional view of a main part of a substrate processing apparatus according to some embodiments of the present disclosure.

As illustrated in FIG. 4, the rotation arm 222 includes a support 222a supporting the wafer 100 and a curved portion 222b. As illustrated in FIGS. 10A to 10C, the support 222a is configured to include a downward inclination from the vicinity of the rotary shaft 221 in a side view. In the embodiments, a portion of the support 222a is inclined, and a gradient of the inclination is uniform. When the rotation arm 222 transfers the wafer 100, the support 222a is configured to support the wafer 100 with an upper end of the inclination located near a boundary of an edge of the wafer 100 (see FIGS. 10A to 10C). Further, the curved portion 222b is installed at the lower end portion of the support 222a such that the curved portion 222b is curved upward.

As illustrated in FIGS. 1 and 2, when the wafers 100 are mounted on the substrate mounting surface 211, the four rotation arms 222 are located between the adjacent process spaces 209, and are respectively retreated to four retreat spaces Y near the bottom 204.

When the wafers 100 mounted on the substrate mounting surface 211 are transferred to the adjacent substrate mounting surface 211, as illustrated in FIG. 4, the wafers 100 mounted on the respective substrate mounting surfaces 211a to 211d are mounted on the respective lift pins 207 by raising the lift pins 207.

Each of the four rotation arms 222 is disposed below the wafer 100 when rising from the retreat space Y and rotating clockwise by 45 degrees. At this time, the support 222a supports the wafer 100 with the upper end of the inclination of the support 222a located near the boundary of the edge of the wafer 100. Thereafter, when the lift pins 207 are lowered, the wafers 100 are transferred on the support 222a of the rotation arm 222. Further, while supporting the wafers 100, the rotation arms 222 rotate, for example, clockwise by 90 degrees to transfer the wafers 100 to areas above adjacent substrate mounting surfaces 211. Thereafter, when the lift pins 207 rise, the wafers 100 supported by the rotation arms 222 are respectively mounted on the lift pins 207. Each of the four rotation arms 222 rotates clockwise by 45 degrees and is then lowered to the retreat space Y. Thereafter, when the lift pins 207 are lowered, the wafers 100 mounted on the lift pins 207 are mounted on the respective substrate mounting surfaces 211a to 211d (see FIG. 2).

The rotation arm 222 is configured such that the support 222a includes an inclination. Therefore, even in case of a deformed wafer 100, when the rotation arm 222 supports the deformed wafer 100, the upper end of the inclination of the support 222a first supports the vicinity of the boundary of the edge of the wafer 100 (see FIGS. 10A and 10B). Thereafter, contact points between the support 222a and the lower surface of the wafer 100 may be increased toward the lower side of the inclination while maintaining contact at contact start points with the upper end of the inclination and the vicinity of the boundary of the edge of the wafer 100 as the contact start points (see FIG. 10C). Since the rotation arm 222 may regulate the direction of contact between the support 222a and the wafer 100 in this way, it is possible to suppress rattling of the wafer 100 when the wafer 100 is supported and to suppress the wafer 100 from being dropped.

Further, as described above, the rotation arm 222 is configured to include a curved portion 222b curved upward at the lower end of the support 222a. As illustrated in FIG. 11, the curved portion 222b includes a curved portion W curved to gradually rise upward from the lower end of the support 222a.

This curved portion W resists the movement of the wafer 100 which moves toward the curved portion 222b, and thus may restrict the movement of the wafer 100 to the curved portion 222b. Specifically, when the rotation arm 222 transfers the wafer 100, even when a centrifugal force is applied to the wafer 100 such that the wafer 100 is about to be dropped from the support 222a, the movement of the wafer 100 to the curved portion 222b may be restricted by the curved portion W. Thus, it is possible to more reliably prevent the wafer 100 from being dropped.

Further, as illustrated in FIGS. 12A and 12B, the curved portion 222b has a radius of curvature such that the curved portion 22b is not in contact with an outer peripheral sidewall C of the wafer 100. In the embodiments, the outer peripheral sidewall C of the wafer 100 refers to an outer peripheral portion other than the upper surface and the lower surface of the wafer 100. In the process of manufacturing a semiconductor device, the outer peripheral sidewall of the wafer 100 is chamfered, and a shape of the chamfered outer peripheral sidewall may have a large inherent difference due to variations in machining accuracy, such that the shape may be a polygonal shape, a linear shape, and the like or may be an R shape as illustrated in FIGS. 12A and 12B.

As an example in which the curved portion 222b has a radius of curvature such that the curved portion 222b is not in contact with the outer peripheral sidewall C of the wafer 100, a case where the curvature radius of the curved portion W in the curved portion 222b is larger than the curvature radius of the outer peripheral sidewall C near the lower surface of the wafer 100 will be described (see FIG. 12A).

As described above, when transferring the wafer 100, the movement of the wafer 100 to the curved portion 222b can be restricted by the curved portion W. Further, since the curvature of the curved portion W is gentler than the curvature of the outer peripheral sidewall C near the lower surface of the wafer 100, it is possible to avoid contact between the outer peripheral sidewall C and a configuration surface of the curved portion 222b (see FIG. 12B). Therefore, since it is possible to avoid delamination of an excess film adhered to the outer peripheral sidewall C of the wafer 100, it is possible to prevent generation of particles in the process chamber 201.

Figure 13A:
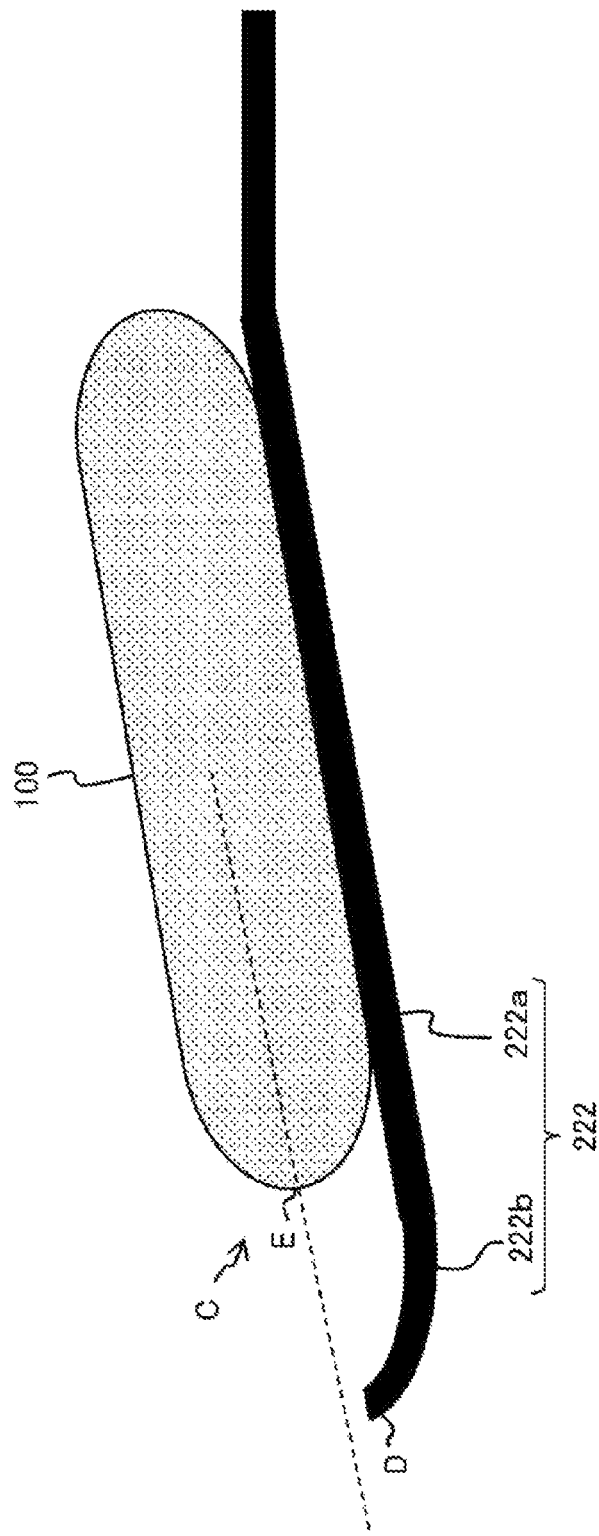
FIGS. 13A and 13B are views illustrating a relationship between a rotation arm and a wafer in a substrate processing apparatus according to some embodiments of the present disclosure.
Figure 13B:
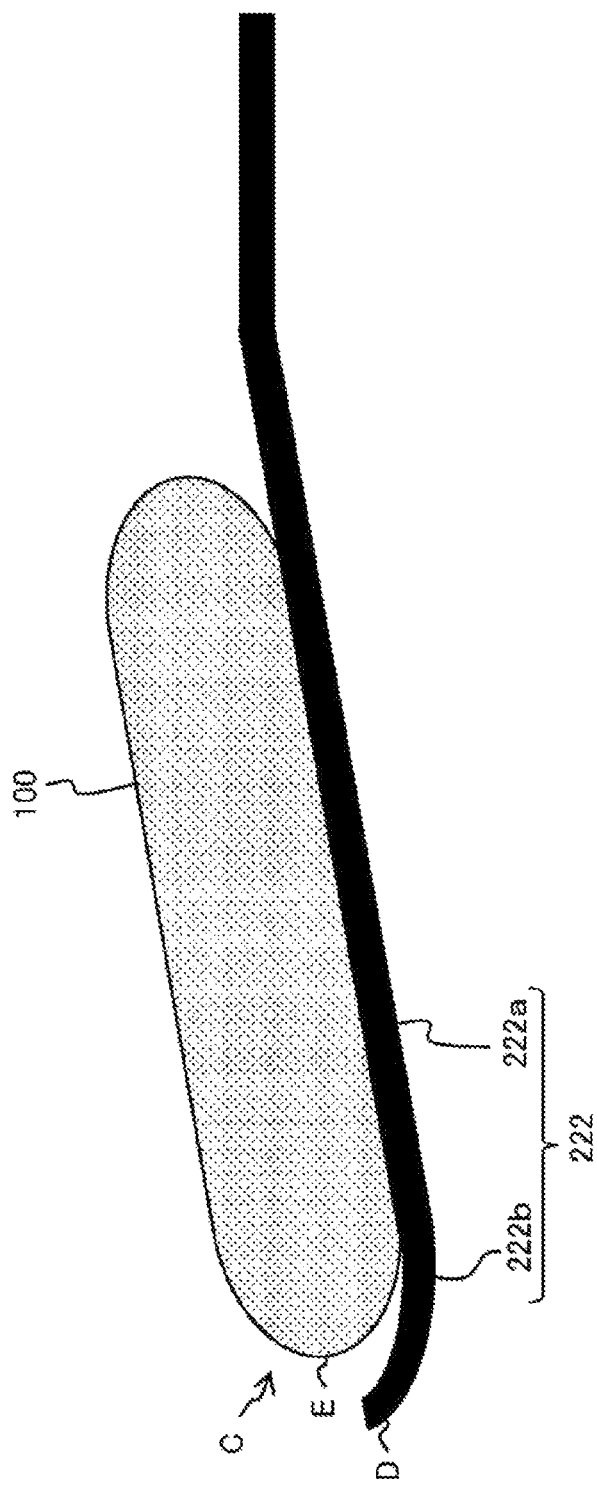

Further, when the rotation arm 222 supports the wafer 100, a position of a portion E of the outer peripheral sidewall C of the wafer 100, which is the most protruding portion toward the curved portion (222b), is higher than a position of a front end D of the curved portion 222b (see FIG. 13A). Therefore, even when the wafer 100 may be moved to the curved portion 222b when the wafer 100 is transferred, it is possible to avoid contact between the front end D of the curved portion 222b and the protruding portion E of the outer peripheral sidewall C (see FIG. 13B).

In the outer peripheral sidewall C, the excess film is most adhered to the vicinity of the protruding portion E. Further, in the curved portion 222b, the excess film is most delaminated from the front end D. Therefore, even when the wafer 100 is moved to the curved portion 222b, it is possible to minimize the delamination of the excess film by avoiding contact between the front end D and the protruding portion E.

In addition, a position of the front end F of the curved portion 222b in the rotation arm 222 and a position of the other end G of the rotation arm 222 have a predetermined range of difference (see FIG. 14). The predetermined range of difference refers to a difference between the position of the front end F and the position of the other end G when the support 222a includes a minimum inclination such that the support 222a may support the wafer 100 in a state in which the upper end of the inclination of the support 222a is located near the boundary of the edge of the wafer 100 even when a maximum deformation, which may be assumed to occur, occurs in the wafer 100. That is, the predetermined range of difference refers to a difference between the position of the front end F and the position of the other end G when the support 222a includes a minimum inclination to suppress the rattling of the wafer 100 when the support 222a supports the wafer 100 even when a maximum deformation, which may be assumed to occur, occurs in the wafer 100.

As described above, the rotation arm 222 is configured such that the support 222a includes the inclination to suppress the rattling of the wafer 100 during the transfer of the wafer 100. Since the support 222a includes the inclination, a vertical movement space of the rotation arm 222 from a non-mounting state to a mounting state of the wafer 100 becomes larger, as compared with the related-art rotation arm in the horizontal posture.

When the vertical movement space of the rotation arm 222 becomes large, a height H of a movement space of the rotation arm 222 in the process chamber 201 (see FIG. 4) also becomes large. When the height H of the movement space of the rotation arm 222 becomes large, the processing gases and the like in the respective process spaces 209a to 209d may be mixed, causing an error in the substrate processing described above.

In the embodiments, the difference between the position of the front end F of the curved portion 222b and the position of the other end G of the rotation arm 222 is set to fall within the aforementioned range to avoid the mixing of the processing gases and the like. That is, according to the rotation arm 222 of the embodiments, since the height H of the movement space of the rotation arm 222 in the process chamber 201 may be minimized, it is possible to increase the internal pressure of each of the process spaces 209a to 209d to separate the respective gases, whereby the respective gases may be processed appropriately.

(4) Effects According to the Embodiments

According to the embodiments, one or more effects as set forth below may be achieved.

(a) The rotation arm 222 of the embodiments is configured such that the support 222a includes the inclination. Thus, when the rotation arm 222 supports the deformed wafer 100 during the transfer of the wafer 100, the direction of contact between the support 222a and the wafer 100 may be regulated. Therefore, it is possible to suppress the rattling of the wafer 100 when the rotation arm 222 supports the wafer 100. As a result, the rotation arm 222 may prevent the dropping of the wafer 100.

(b) In the embodiments, the rotation arm 222 is configured to support the wafer 100 with the upper end of the inclination located near the boundary of the edge of the wafer 100 when the rotation arm 222 supports the wafer 100. This makes it possible to increase the contact point between the support 222a and the lower surface of the wafer 100 toward the lower side of the inclination while maintaining contact at contact start points with the upper end of the inclination and the vicinity of the boundary of the edge of the wafer 100 as the contact start points. Since the rotation arm 222 may regulate the direction of contact between the support 222a and the wafer 100 in this way, it is possible to suppress the rattling of the wafer 100 when the rotation arm 222 supports the wafer 100. As a result, the rotation arm 222 may reliably suppress the dropping of the wafer 100.

(c) The rotation arm 222 of the embodiments is configured to include the curved portion 222b curved upward at the lower end portion of the support 222a. The curved portion 222b includes the curved portion W curved to gradually rise upward from the lower end portion of the support 222a (see FIG. 11). This curved portion W resists the movement of the wafer 100 which moves toward the curved portion 222b, thereby restricting the movement of the wafer 100 to the curved portion 222b. Thus, the rotation arm 222 can reliably suppress the dropping of the wafer 100.

(d) In the embodiments, the curved portion 222b of the rotation arm 222 is configured to have a radius of curvature such that the curved portion 222b is not in contact with the outer peripheral sidewall C of the wafer 100. This makes it possible to avoid contact between the outer peripheral sidewall C and the configuration surface of the curved portion 222b during the transfer of the wafer 100. Therefore, since the delamination of the excess film adhered to the outer peripheral sidewall C of the wafer 100 may be avoided, it is possible to prevent the generation of particles in the process chamber 201.

(e) In the embodiments, the position of the portion E in the outer peripheral sidewall C, which is the most protruding portion toward the curved portion, is above the position of the front end D of the curved portion 222b when the rotation arm 222 supports the wafer 100. This makes it possible to avoid contact between the front end D of the curved portion 222b and the protruding portion E of the outer peripheral sidewall C during the transfer of the wafer 100 by the rotation arm 222. Even in the case where the wafer 100 is moved to the curved portion 222b, it is possible to minimize delamination of the excess film by avoiding the contact with the protruding portion E of the front end D.

(f) In the embodiments, the position of the front end F of the curved portion 222b in the rotation arm 222 and the position of the other end G of the rotation arm 222 have a predetermined range of difference. Therefore, since the height H of the movement space of the rotation arm 222 in the process chamber 201 may be minimized, it is possible to increase the internal pressure of the respective process spaces 209a to 209d to separate the respective gases, whereby the respective gases may be processed appropriately (see FIG. 14).

Other Embodiments of the Present Disclosure

While the embodiments of the present disclosure have been specifically described above, the present disclosure is not limited to the aforementioned embodiments but may be variously modified without departing from the spirit of the present disclosure.

(a) In the aforementioned embodiments, there have been described examples in which the support 222a is configured to include a downward inclination from the side near the rotary shaft 221, but the present disclosure is not limited to the aforementioned embodiments. For example, the support 222a may be configured to include an upward inclination from the side near the rotary shaft 221. Even in this case, the rotation arm 222 may suppress the rattling of the wafer 100 when the rotation arm 22 supports the wafer 100, thereby preventing the dropping of the wafer 100.

(b) Further, in the aforementioned embodiments, there have been described examples in which the support 222a is configured such that a portion of the support 222a is inclined and the gradient of the inclination is uniform, but the present disclosure is not limited to the aforementioned embodiments. For example, the support 222a may be configured such that the entire support 222a is inclined or the gradient of the inclination is changed. When the entire support 222a is inclined, the upper end of the support 222a matches the upper end of the inclination. Even in these cases, the rotation arm 222 may suppress the rattling of the wafer 100 when the rotation arm 222 supports the wafer 100, thereby preventing the dropping of the wafer 100.

(c) Further, in the aforementioned embodiments, there have been described examples in which the support 222a is formed such that the straight rod member is continuous with multiple corners in the plane view, but the present disclosure is not limited to the aforementioned embodiments. For example, the support 222a may be formed in a curve shape in the plane view as long as the support 222a includes a region to support the wafer 100. Even in this case, the rotation arm 222 may suppress the rattling of the wafer 100 when rotation arm 222 supports the wafer 100, thereby preventing the dropping of the wafer 100.

(d) In addition, in the aforementioned embodiments, there been described the rotation arm 222 as an example, but the present disclosure is not limited to the aforementioned embodiments. For example, the robot arm 240 may have the aforementioned configuration. Even in this case, the robot arm 240 may suppress the rattling of the wafer 100 when the robot arm 240 supports the wafer 100, thereby preventing the dropping of the wafer 100.

(e) Further, in the aforementioned embodiments, there have been described examples where the curved portion 222b has the radius of curvature such that the curved portion 22b is not in contact with the outer peripheral sidewall C, and where the position of the protruding portion E of the outer peripheral sidewall C is above the position the front end D of the curved portion 222b, as a configuration in which the delamination of the excess film adhered to the outer peripheral sidewall C is avoided during the transfer of the wafer 100. This does not mean that the aforementioned effects are achieved only when the two cases are all satisfied. In a case where either one of the cases is satisfied, the effects are achieved.

(f) Further, in the aforementioned embodiments, there has been described the stress difference occurring between the insulating film 102 (SiO film) and the sacrificial film 112 (SiN film) in the laminated film as an example of the cause of deformation of the wafer 100, but the present disclosure is not limited to the aforementioned embodiments. For example, even in a case where the wafer 100 is unevenly heated, such an uneven heating may cause the wafer 100 to be deformed. That is, regardless of the cause by which the wafer is deformed, it is possible to suppress the rattling of the wafer 100, thereby preventing the dropping of the wafer 100, when the rotation arm 222 described in the aforementioned embodiments supports the deformed wafer 100.

(g) Further, in the aforementioned embodiments, there have been described examples in which the laminated film of the SiO film and the SiN film is formed on the wafer 100, but the present disclosure is not limited to the aforementioned embodiments. For example, the SiO film and the SiN film may be independently formed on the wafer 100. That is, regardless of whether the film formed on the wafer 100 is the laminated film, it is possible to suppress the rattling of the wafer 100, thereby preventing the dropping of the wafer 100, when the rotation arm 222 described in the aforementioned embodiments supports the deformed wafer 100.

(h) Further, in the aforementioned embodiments, there have been described examples in which the SiO film or the SiN film is formed on the wafer 100, but the present disclosure is not limited to the aforementioned embodiments. For example, a film containing a metal component such as Ti may be used as the film to be formed. Further, there have been described examples where O or N is combined with Si, a metal component, or the like, but the present disclosure is not limited to the aforementioned embodiments. For example, carbon, another metal, or the like may be used.

Aspects of the Present Disclosure

Hereinafter, some embodiments of the present disclosure will be additionally stated as supplementary notes.

[Supplementary Note 1]

According to some embodiments of the present disclosure, there is provided a substrate processing apparatus, including:

- a process chamber in which a substrate is processed;
- a gas supplier configured to supply a gas into the process chamber;
- at least one substrate mounting table disposed in the process chamber and including a substrate mounting surface on which the substrate is mounted; and
- an arm configured to transfer the substrate to the substrate mounting surface while supporting a lower surface of the substrate, wherein the arm includes a support that includes an inclination and is configured to support the substrate.

[Supplementary Note 2]

In the substrate processing apparatus of Supplementary Note 1, the support is configured to support the substrate with an upper end of the inclination being located near a boundary of an edge of the substrate.

[Supplementary Note 3]

In the substrate processing apparatus of Supplementary Note 1 or 2, the arm is installed at a rotary shaft, the at least one substrate mounting table includes a plurality of substrate mounting tables including a plurality of substrate mounting surfaces respectively and disposed in a circumferential manner around the rotary shaft, and the arm is configured to transfer the substrate among the plurality of substrate mounting surfaces by rotating the rotary shaft.

[Supplementary Note 4]

In the substrate processing apparatus of any one of Supplementary Notes 1 to 3, the arm further includes a curved portion curved upward at a lower end portion of the support.

[Supplementary Note 5]

In the substrate processing apparatus of Supplementary Note 4, the curved portion has a radius of curvature such that the curved portion is not in contact with an outer peripheral sidewall of the substrate.

[Supplementary Note 6]

In the substrate processing apparatus of Supplementary Note 5, a position of a portion of an outer peripheral sidewall, which is the most protruding portion toward the curved portion, of the substrate is above a position of a front end portion of the curved portion when the arm supports the substrate.

[Supplementary Note 7]

In the substrate processing apparatus of any one of Supplementary Notes 4 to 6, a position of a front end of the curved portion in the arm and a position of the other end of the arm are formed to have a predetermined range of difference.

[Supplementary Note 8]

According to other embodiments of the present disclosure, there is provided a method of manufacturing a semiconductor device, including:

processing a substrate in a process chamber;

supplying a gas from a gas supplier into the process chamber; and transferring the substrate to a substrate mounting table disposed in the process chamber and including a substrate mounting surface on which the substrate is mounted while supporting a lower surface of the substrate, wherein the act of transferring the substrate is performed by an arm including a support that includes an inclination and is configured to support the substrate.

[Supplementary Note 9]

According to other embodiments of the present disclosure, there is provided a program that causes, by a computer, a substrate processing apparatus to perform a process, the process including:

processing a substrate in a process chamber;

supplying a gas from a gas supplier into the process chamber; and transferring the substrate to a substrate mounting table disposed in the process chamber and including a substrate mounting surface on which the substrate is mounted while supporting a lower surface of the substrate by an arm including a support that includes an inclination and is configured to support the substrate.

According to the present disclosure in some embodiments, it is possible to provide a technique that stably transfers a deformed substrate without dropping the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:

a process chamber in which a substrate is processed;

a gas supplier configured to supply a gas into the process chamber;

at least one substrate mounting table disposed in the process chamber and including a substrate mounting surface on which the substrate is mounted; and an arm configured to transfer the substrate to the substrate mounting surface while supporting a lower surface of the substrate, wherein the arm includes a support that is formed to be inclined and has an upper end and a lower end, and wherein the arm further includes a curved portion that is curved upward at the lower end of the support and that has a radius of curvature such that the curved portion is not in contact with an outer peripheral sidewall of the substrate when the substrate is supported by the support.

2. The substrate processing apparatus according to claim 1, wherein the support is configured such that the upper end of the support is located near a boundary of an edge of the substrate when the substrate is supported by the support.

3. The substrate processing apparatus according to claim 2, wherein the arm is installed at a rotary shaft, wherein the at least one substrate mounting table includes a plurality of substrate mounting tables including a plurality of substrate mounting surfaces respectively and disposed in a circumferential manner around the rotary shaft, and wherein the arm is configured to transfer the substrate among the plurality of substrate mounting surfaces by rotating the rotary shaft.

4. The substrate processing apparatus according to claim 1, wherein the curved portion is configured such that a position of a portion of the outer peripheral sidewall, which is the most protruding portion toward the curved portion, of the substrate is above a position of a front end portion of the curved portion when the arm supports the substrate.

5. The substrate processing apparatus according to claim 1, wherein the arm is formed such that a position of a front end of the curved portion is lower than a position of the other end of the arm by a predetermined distance.

6. The substrate processing apparatus according to claim 1, wherein the arm is installed at a rotary shaft, wherein the at least one substrate mounting table includes a plurality of substrate mounting tables including a plurality of substrate mounting surfaces respectively and disposed in a circumferential manner around the rotary shaft, and wherein the arm is configured to transfer the substrate among the plurality of substrate mounting surfaces by rotating the rotary shaft.

7. The substrate processing apparatus according to claim 1, wherein the curved portion is configured such that a position of a portion of the outer peripheral sidewall, which is the most protruding portion toward the curved portion, of the substrate is above a position of a front end portion of the curved portion when the arm supports the substrate.

8. The substrate processing apparatus according to claim 1, wherein the arm is formed such that a position of a front end of the curved portion is lower than a position of the other end of the arm by a predetermined distance.

9. The substrate processing apparatus according to claim 1, wherein the curved portion is configured such that a position of a portion of the outer peripheral sidewall, which is the most protruding portion toward the curved portion, is above a position of a front end portion of the curved portion when the arm supports the substrate.

10. The substrate processing apparatus according to claim 1, wherein the arm is formed such that a position of a front end of the curved portion is lower than a position of the other end of the arm by a predetermined distance.

11. The substrate processing apparatus according to claim 1, wherein the curved portion is configured such that a position of a portion of the outer peripheral sidewall, which is the most protruding portion toward the curved portion, of the substrate is above a position of a front end portion of the curved portion when the arm supports the substrate.

12. The substrate processing apparatus according to claim 11, wherein the arm is formed such that the position of the front end of the curved portion is lower than a position of the other end of the arm by a predetermined distance.

13. The substrate processing apparatus according to claim 1, wherein the arm is formed such that a position of a front end of the curved portion is lower than a position of the other end of the arm by a predetermined distance.

* * * * *